United States Patent

Sung et al.

[11] Patent Number: 5,663,081
[45] Date of Patent: Sep. 2, 1997

[54] METHOD FOR MAKING A HIGH-TEMPERATURE SUPERCONDUCTING FIELD-EFFECT TRANSISTOR WITH THICK SUPERCONDUCTING CHANNEL LAYER

[75] Inventors: Gun-Yong Sung; Jeong-Dae Suh, both of Daejeon, Rep. of Korea

[73] Assignee: Electronics and Telecommunications Research Institute, Daejeon, Rep. of Korea

[21] Appl. No.: 352,045

[22] Filed: Nov. 30, 1994

[30] Foreign Application Priority Data

Nov. 21, 1994 [KR] Rep. of Korea ............... 94-30618

[51] Int. Cl.$^6$ .................................................. H01B 12/00
[52] U.S. Cl. ........................... 505/330; 505/701; 438/2
[58] Field of Search ......................... 437/42, 910, 913, 437/40 R; 505/330, 701, 729

[56] References Cited

U.S. PATENT DOCUMENTS

| | | | |
|---|---|---|---|
| 4,499,119 | 2/1985 | Smith | 437/910 |
| 5,240,906 | 8/1993 | Bednorz et al. | 505/701 |
| 5,278,136 | 1/1994 | Bednorz et al. | 437/42 |
| 5,326,746 | 7/1994 | Ohtani et al. | 437/42 |
| 5,464,812 | 11/1995 | Inada et al. | 505/701 |
| 5,494,891 | 2/1996 | Nakamura et al. | 505/330 |
| 5,509,183 | 4/1996 | Nakamura et al. | 437/910 |

*Primary Examiner*—Michael Trinh
*Attorney, Agent, or Firm*—Larson and Taylor

[57] ABSTRACT

Disclosed is a method for making a high-temperature superconducting field-effect transistor with a thick superconducting channel, the method comprising the steps of depositing a template layer on an oxide crystal substrate by using a pulse laser depositing apparatus; forming a $YBa_2Cu_3O_{7-x}$ layer on the template layer; patterning the $YBa_2Cu_3O_{7-x}$ layer to form a patterned $YBa_2Cu_3O_{7-x}$ layer having an opening and expose a surface portion of the template layer; depositing a $YBa_2Cu_3O_{7-x}$ channel layer on the surface portion of the template layer and over the patterned $YBa_2Cu_3O_{7-x}$ layer, the channel layer having a thickness of from 60 to 100 nm; sequentially forming an $SrTiO_3$ protective layer and an $SrTiO_3$ insulating layer on the channel layer; dry-etching back portions of the insulating and protective layers using an etching mask so as to expose surface portions of the channel layer; and forming source/drain electrodes on both the surface portions of the channel layer and at the same time forming a gate electrode on the insulating layer in the opening. In the superconducting FET, the channel layer is formed from 60 to 100 nm in thickness between the substrate and the $SrTiO_3$ layers. Even through the channel layer is affected by the stress-strain up to approximately 25 nm in depth from each surfaces thereof, since total depth of surface regions of the channel layer affected thus is about 50 nm, the channel layer has a super-conducting center region of from 10 to 50 nm in thickness in which a strain is completely eliminated.

10 Claims, 3 Drawing Sheets

METHOD FOR MAKING A HIGH-TEMPERATURE SUPERCONDUCTING FIELD-EFFECT TRANSISTOR WITH THICK SUPERCONDUCTING CHANNEL LAYER

BACKGROUND OF THE INVENTION

1. Field of the Invention

The present invention relates to a method for making a high temperature super-conducting field-effect transistor with a thick super-conducting channel layer.

2. Description of the Prior Art

Generally, a super-conducting transistor has widely used as an active device, which has a fast calculating speed, a fast data processing speed and a low-consumption power in characteristics thereof, and can be mainly embodied in a signal processing apparatus, such as a video signal processing system, a high-performance work-station, a satellite signal processing system, a super computer and the like.

FIG. 1 shows a construction of a prior art super-conducting field-effect transistor(hereinafter, referred to as "FET") having an-extremely thin super-conducting channel. In FIG. 1, the prior art super-conducting FET comprises a substrate 11 composed of $YBa_2Cu_3O_{7-x}$, an extremely thin super-conducting channel 12 composed of an oxide superconductor thin film on the principal surface of the substrate 11, and an insulating layer 13 formed on the super-conducting channel 12. The FET further comprises source/drain electrodes 15 and 16 which are formed on both ends of the super-conducting channel layer 12 and formed of a metal, and a gate electrode 14 which is formed on the insulating layer 13 and formed of a metal. In this FET structure, the insulating layer 13 is formed of $SrTiO_3$ and the super-conducting channel 12 is composed of a high temperature superconductor. This super-conducting FET is composed of a three-layer structure in which metal-insulator-high temperature superconductor layers are sequentially formed on the substrate 11, and is disclosed in European Patent Publication No. 0 533 519 A2.

FIG. 2 shows a construction of another prior art super-conducting FET with an inverted three-layer structure. The super-conducting FET of FIG. 2 comprises an $SrTiO_3$ substrate 21 doped with Nb, a platinum layer 22 formed on a main surface of the substrate 21, and a super-conducting channel layer 24 formed above the platinum layer 22 with an insulating layer 23 formed therebetween. The super-conducting FET of FIG. 2 further comprises metal source/drain electrodes 25 and 26 which are formed on the super-conducting channel layer 24 and electrically isolated from each other, and a gate electrode 27 which is formed on the back surface of the substrate 21. This super-conducting FET of FIG. 2 has an inverted three-layer structure in comparison with the super-conducting FET of FIG. 1, and is disclosed in U.S. Pat. No. 5,278,138.

In these super-conducting FETs, however, since a high-temperature super-conducting film is utilized as a gate, there arises a serious problem that electric field effect is lowered within several percents.

Also, there are the reasons that high field electric effect can not be obtained in the prior art super-conducting FETs. One of the reasons is that an ultra-thin film having 100 Å or less in thickness is embodied as a high-temperature super-conducting channel layer of the FET. In practical fabrication of the high-temperature super-conducting layer, there arises several problems.

First, in case of making a $YBa_2CuO_{7-x}$ super-conducting layer having extremely thin film, since the super-conducting layer reacts chemically on moisture in air and is decomposed at a very fast speed to be changed to other material, it loses a super-conducting characteristics thereof.

Secondly, in fabrication of the super-conducting transistor, since several steps of etching processes have to be carried out, an extremely thin super-conducting layer is seriously lowered in chemical stability.

Finally, if thickness of an extremely thin super-conducting layer is further thin, reproduction of such a super-conducting layer is seriously lowered because of a limit of an optimum range of a film formation condition.

SUMMARY OF THE INVENTION

It is an object of the present invention to provide a method for making a high-temperature super-conducting field-effect transistor with a thick super-conducting channel layer in which the thickness of the super-conducting channel layer is thick about six times in comparison with that of the prior art super-conducting field-effect transistor, and yet can be utilized as a channel thereof.

It is another object of the present invention to provide a method for making a high-temperature super-conducting field-effect transistor which has a relative thick super-conducting channel layer in comparison with that of the prior art field-effect transistor so as to improve yield of transistors.

According to the aspect of the present invention, the method for making a high-temperature super-conducting field-effect transistor with a thick super-conducting channel, the method comprising the steps of preparing an oxide crystal substrate; depositing a template layer on a main surface of the oxide crystal substrate by using a pulse laser depositing apparatus; forming a $YBa_2Cu_3O_{7-x}$ layer on the template layer; patterning the $YBa_2Cu_3O_{7-x}$ layer to form a patterned $YBa_2Cu_3O_{7-x}$ layer having an opening and expose a surface portion of the template layer; depositing a $YBa_2Cu_3O_{7-x}$ channel layer on the surface portion of the template layer and over the patterned $YBa_2Cu_3O_{7-x}$ layer, the $YBa_2Cu_3O_{7-x}$ channel layer having a thickness of from 60 to 100 nm; sequentially forming an $SrTiO_3$ protective layer and an $SrTiO_3$ insulating layer on the $YBa_2Cu_3O_{7-x}$ channel layer; dry-etching back portions of the insulating and protective layers using an etching mask so as to expose surface portions of the $YBa_2Cu_3O_{7-x}$ channel layer; and forming source/drain electrodes on both the surface portions of the $YBa_2Cu_3O_{7-x}$ channel layer and at the same time forming a gate electrode on the $SrTiO_3$ insulating layer in the opening.

In this method, said oxide crystal substrate is composed of one of materials of an oxide class of superconductors, such as $SrTiO_3$, $LaAlO_3$, MgO, $NdGaO_3$, $LaSrAlO_4$, and $LaSrGaO_4$, and said template layer is composed of $PrBa_2Cu_3O_{7-x}$.

In this method, said method further comprises the step of attaching the oxide crystal substrate to a substrate heating plate of the pulse laser depositing apparatus by using a silver paste.

In this method, the step of depositing the template layer is carried out in the range of 600° C. to 650° C., and under oxygen pressure of about 100 mTorr so as to form the template layer having a thickness of from 50 to 200 nm.

In this method, the step of forming the $YBa_2Cu_3O_{7-x}$ layer is carried out in the range of from 720° C. to 780° C., and under oxygen pressure of about 100 mTorr so as to form the $YBa_2Cu_3O_{7-x}$ layer having about 500 nm in thickness.

In this method, the step of depositing the $YBa_2Cu_3O_{7-x}$ channel layer is carried out in the range of from 720° C. to 780° C., and under oxygen pressure of 100 mTorr, and the step of forming the insulating layer is carried out in the range of from 650° C. to 750° C., and wherein said protective layer has a thickness of from 10 to 50 nm and said insulating layer has a thickness of from 100 to 500 nm.

In this method, during performing the step of forming the $SrTiO_3$ protective layer, the $YBa_2Cu_3O_{7-x}$ channel layer between the $SrTiO_3$ protective layer and the surface portion of the template layer is changed in stress to be changed to a stress-changed layer.

In this method, during performing the step of forming the $YBa_2Cu_3O_{7-x}$ layer the $YBa_2Cu_3O_{7-x}$ layer is grown in such a manner that a-axis of the $YBa_2Cu_3O_{7-x}$ layer is perpendicular to the substrate by means of the template layer.

Since the super-conducting FET fabricated according to the method of the present invention has a relatively very thick $YBa_2Cu_3O_{7-x}$ layer of 60 nm and more possible to serve as a channel, in comparison with the prior art superconducting FET, it is possible to enhance yield of superconducting FET in a production line, and thereby causing a property of a super-conducting FET to be improved.

BRIEF DESCRIPTION OF THE DRAWINGS

This invention may be better understood and its object and advantage will become apparent to those skilled in the art by reference to the accompanying drawings as follows.

DESCRIPTION OF THE PREFERRED EMBODIMENT(S)

Figure 1:
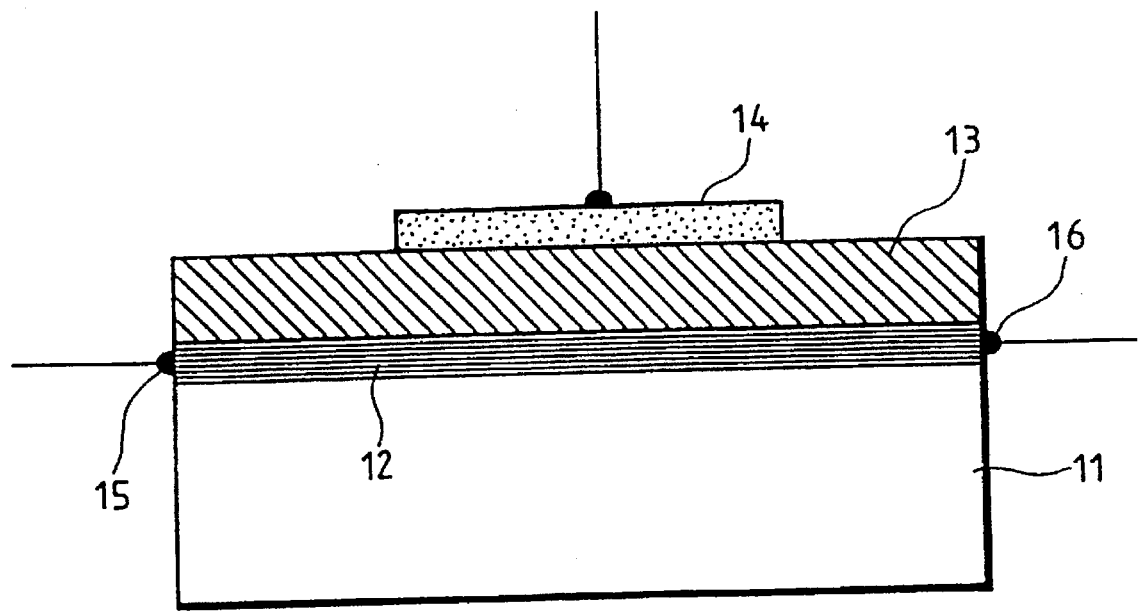
FIG. 1 is a cross-sectional view showing the construction of a prior art super-conducting field-effect transistor which is composed of a three-layer structure of metal-insulator-superconductor.
Figure 2:
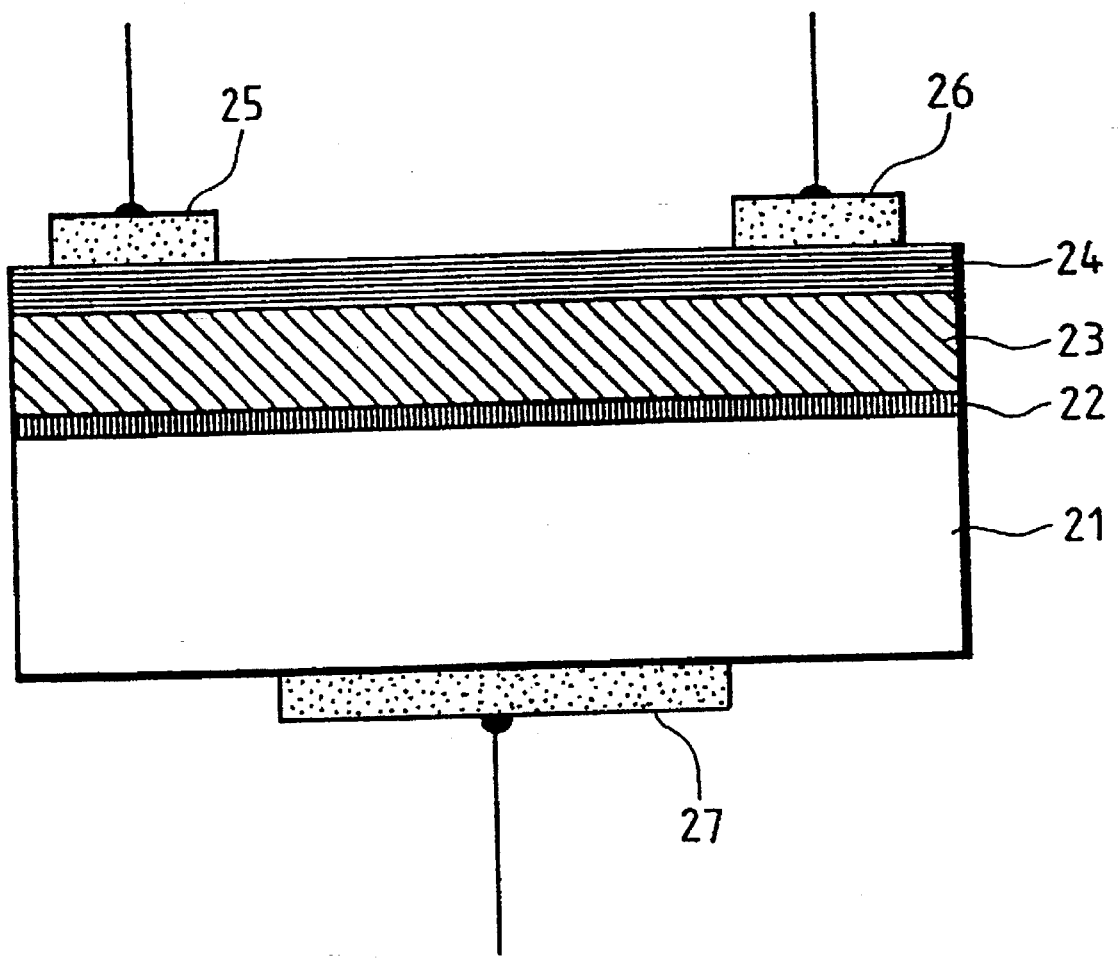
FIG. 2 is a cross-sectional view showing the construction of another prior art super-conducting field-effect transistor which is composed of an inverted three-layer structure.
Figure 3A:
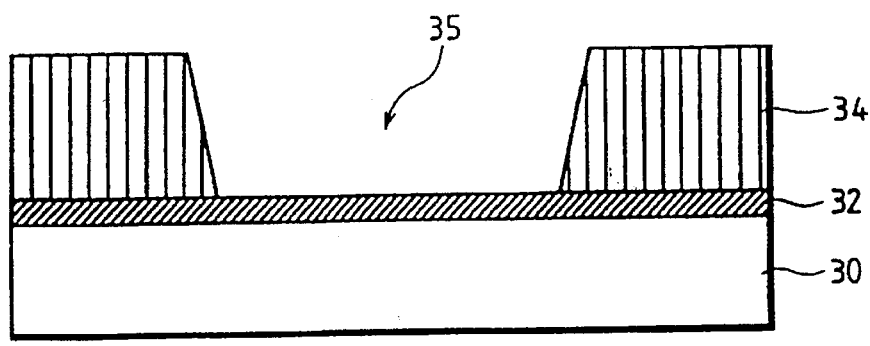
FIGS. 3A to 3D are cross-sectional views showing the steps of making a high-temperature super-conducting field-effect transistor in accordance with one embodiment of the present invention.

Referring to FIG. 3A, on an oxide crystal substrate 30 a template layer 32 and a $YBa_2Cu_3O_{7-x}$ layer 34 are sequentially formed, and then a patterning process is carried out. The forming processes of the template and $YBa_2Cu_3O_{7-x}$ layers 32 and 34 are performed in a pulse laser depositing apparatus as well-known in this art.

First, the oxide crystal substrate 30 is attached to a substrate heating plate in the pulse laser depositing apparatus by using a silver paste. In this state, the template layer 32 is deposited on a main surface of the oxide crystal substrate 30 at a temperature of from 600° C. to 650° C., and under oxygen pressure of about 100 mTorr. As a result, the template layer 32 has the thickness of from 50 to 200 nm. The oxide crystal substrate 30 is composed of one of materials of an oxide class of superconductors, such as $SrTiO_3$, $LaAlO_3$, MgO, $NdGaO_3$, $LaSrAlO_4$, and $LaSrGaO_4$.

In addition, deposition of the template layer 32 is carried out in the range of 600° C. to 650° C., and under oxygen pressure of about 100 mTorr, and therefore the template layer 32 of from 50 to 200 nm in thickness is formed on the oxide crystal substrate 30. The template layer 32 also is composed of $PrBa_2Cu_3O_{7-x}$.

Forming process of the $YBa_2Cu_3O_{7-x}$ layer 34 also is carried out in the range of from 720° C. to 780° C., and under oxygen pressure of about 100 mTorr, and thereby the $YBa_2Cu_3O_{7-x}$ layer 34 has about 500 nm in thickness. Then, by an etching process, a patterned $YBa_2Cu_3O_{8-x}$ layer 34 having an opening 35 is formed on the template layer 32, as shown in FIG. 3A. The opening 35 is formed on an exposed surface portion of the template layer 32.

In this embodiment, the template layer 32 is provided to grow the $YBa_2Cu_3O_{7-x}$ layer whose a-axis becomes perpendicular to the substrate.

Figure 3B:
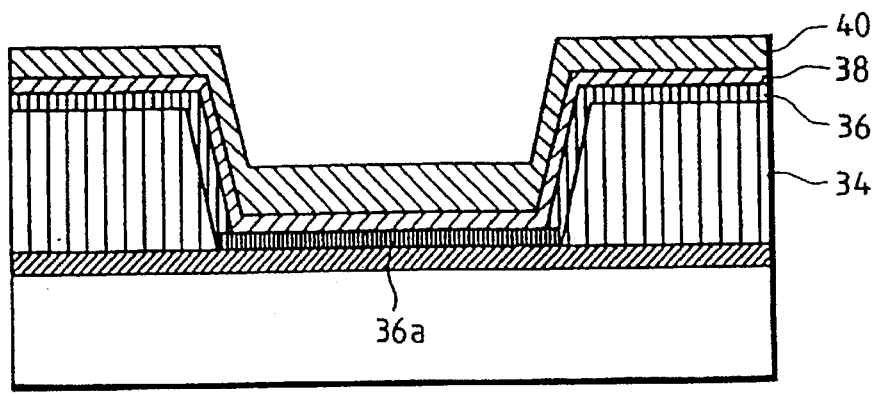

Subsequently, depositing processes of a $YBa_2Cu_3O_{7-x}$ channel layer 36, an $SrTiO_3$ protective layer 38 and an $SrTiO_3$ insulating layer 40 are sequentially carried out, as shown in FIG. 3B.

Depositing process of the $YBa_2Cu_3O_{7-x}$ channel layer 36 is first performed. Then, the $YBa_2Cu_3O_{7-x}$ channel layer 36 having a thickness of from 100 to 500 nm is formed at a temperature of from 720° C. to 780° C., and under oxygen pressure of 100 mTorr. Next, the $SrTiO_3$ protective layer 38 having a thickness of from 10 to 50 nm is deposited on the $YBa_2Cu_3O_{7-x}$ channel layer 36. The deposition of the $SrTiO_3$ insulating layer 40 then is carried out in the range of from 650° C. to 750° C. The $SrTiO_3$ insulating layer 40 has from 100 to 500 nm in thickness. As a result, the structure of FIG. 3B is formed.

In this embodiment, during performing the depositing process of the $SrTiO_3$ protective layer 38, the $YBa_2Cu_3O_{7-x}$ channel layer formed at an interfacial surface between the $SrTiO_3$ protective layer 38 and the surface portion of the template layer 32 is strained by a stress to be changed to a stress-changed $YBa_2Cu_3O_{7-x}$ layer 36a.

Figure 3C:
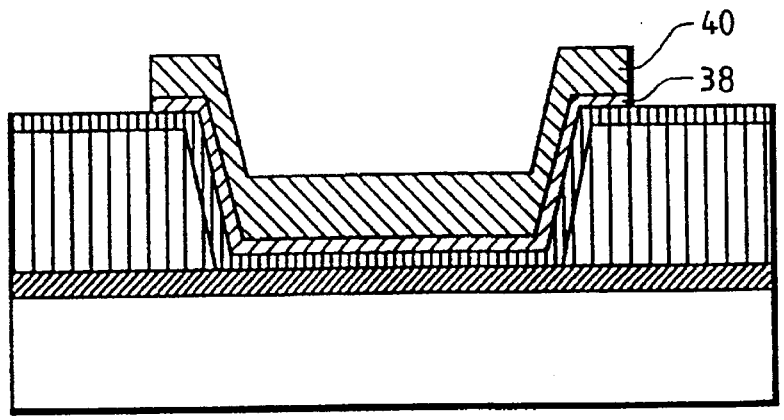

In addition, dry-etching process is performed, and therefore portions of the insulating and protective layers are etched away, as shown in FIG. 3C. For example, using an etching mask, the insulating and protective layers are selectively removed. As a result, surface portions of the $YBa_2Cu_3O_{7-x}$ channel layer 36 are exposed.

Figure 3D:
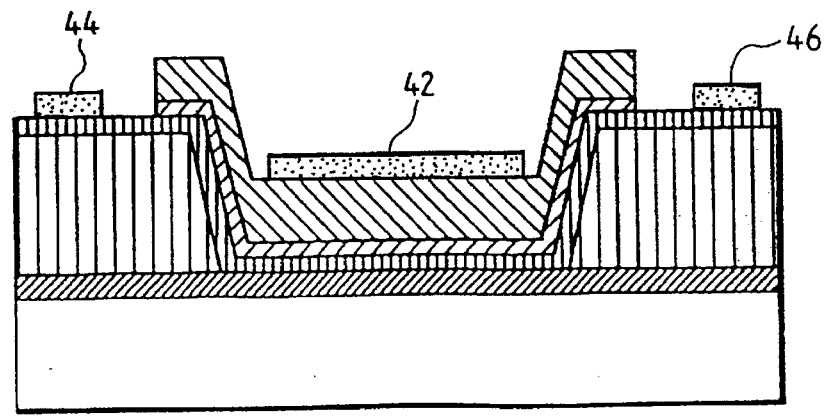

Finally, source/drain electrodes 44 and 45 are coated on both the exposed surface portions of the $YBa_2Cu_3O_{7-x}$ channel layer 36, respectively, and at the same time a gate electrode 42 is coated on the $SrTiO_3$ insulating layer 40 in the opening 35, as shown in FIG. 3D. Therefore, the processes for making the high-temperature super-conducting FET are completed.

The $YBa_2Cu_3O_{7-x}$ layer of the super-conducting FET has a superconducting characteristics that property thereof is significantly changed along respective crystal axis because of a crystalline structure thereof, and also has a strain dependency according to the superconducting characteristics to be determined in accordance with axis directions.

In case a $YBa_2Cu_3O_{7-x}$ layer is grown on a substrate in such a manner that a-axis of the $YBa_2Cu_3O_{7-x}$ layer is perpendicular to a surface of the substrate, an tension stress affects a region in the vicinity of an interface therebetween because of lattice mismatching therebetween and thermal expansion coefficient therebetween, and thereby a lot of point defects are generated in the region. Since these point defects serve as a scattering center, superconducting electron pairs collide with the point defects, and thereby causing a superconductor property to be lost in the $YBa_2Cu_3O_{7-x}$ layer. Accordingly, in a region having up to about 25 nm in depth from a surface of the $YBa_2Cu_3O_{7-x}$ layer, which the tension stress can affects in $YBa_2Cu_3O_{7-x}$ layer, such a superconductor property does not occur.

As described above, if the super-conducting FET is fabricated in accordance with the above mentioned process, since a strain effect occurring at an interface between the substrate and the $YBa_2Cu_3O_{7-x}$ channel layer whose a-axis is perpendicular to the substrate occurs even in regions in the vicinity of both surfaces of the $YBa_2Cu_3O_{7-x}$ channel layer, the strained $YBa_2Cu_3O_{7-x}$ channel layer has a center region of from about 10 to 50 nm in thickness in which a strain is completely eliminated.

In detail, in the super-conducting FET of the present invention, the $YBa_2Cu_3O_{7-x}$ channel layer is formed from 60 to 100 nm in thickness between the substrate and the $SrTiO_3$ layers. Even through the $YBa_2Cu_3O_{7-x}$ channel layer is affected by the strain up to approximately 25 nm in depth from each surfaces thereof, since total depth of surface regions of the $YBa_2Cu_3O_{7-x}$ channel layer affected thus is about 50 nm, the $YBa_2Cu_3O_{7-x}$ channel layer has a super-conducting center region of from 10 to 50 nm in thickness in which a strain is completely eliminated.

Therefore, since the super-conducting FET fabricated according to the method of the present invention has a relatively very thick $YBa_2Cu_3O_{7-x}$ layer of 60 nm and more possible to serve as a channel, in comparison with the prior art super-conducting FET, it is possible to enhance yield of super-conducting FET in a production line, and thereby causing a property of a super-conducting FET to be improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for making a high-temperature super-conducting field-effect transistor with a thick super-conducting channel, the method comprising the steps of:

preparing an oxide crystal substrate;

depositing a template layer on a main surface of the oxide crystal substrate by using a pulse laser depositing apparatus;

forming a $YBa_2Cu_3O_{7-x}$ layer on the template layer;

patterning the $YBa_2Cu_3O_{7-x}$ layer to form a patterned $YBa_2Cu_3O_{7-x}$ layer having an opening and expose a surface portion of the template layer;

depositing a $YBa_2Cu_3O_{7-x}$ channel layer on the surface portion of the template layer and over the patterned $YBa_2Cu_3O_{7-x}$ layer, the $YBa_2Cu_3O_{7-x}$ channel layer having a thickness of from 60 to 100 nm;

sequentially forming an $SrTiO_3$ protective layer and an $SrTiO_3$ insulating layer on the $YBa_2Cu_3O_{7-x}$ channel layer;

dry-etching back portions of the insulating and protective layers using an etching mask so as to expose surface portions of the $YBa_2Cu_3O_{7-x}$ channel layer; and forming source and drain electrodes on both the surface portions of the $YBa_2Cu_3O_{7-x}$ channel layer and at the same time forming a gate electrode on the $SrTiO_3$ insulating layer in the opening.

2. The method as defined in claim 1, wherein said oxide crystal substrate is an oxide of superconductors.

3. The method as defined in claim 2, wherein said oxide of superconductors is selected from the group consisting of $SrTiO_3$, $LaAlO_3$, $MgO$, $NdGaO_3$, $LaSrAlO_4$, and $LaSrGaO_4$.

4. The method as defined in claim 1, wherein said template layer is composed of $PrBa_2Cu_3O_{7-x}$.

5. The method as defined in claim 1, wherein said method further comprises the step of attaching the oxide crystal substrate to a substrate heating plate of the pulse laser depositing apparatus by using a silver paste.

6. The method as defined in claim 1, wherein the step of depositing the template layer is carried out in a range of 600° C. to 650° C., and under an oxygen pressure of about 100 mTorr so as to form the template layer having a thickness of from 50 to 200 nm.

7. The method as defined in claim 1, wherein the step of forming the $YBa_2Cu_3O_{7-x}$ layer is carried out in a range of from 720° C. to 780° C., and under an oxygen pressure of about 100 mTorr so as to form the $YBa_2Cu_3O_{7-x}$ layer having about 500 nm in thickness.

8. The method as defined in claim 1, wherein the step of depositing the $YBa_2Cu_3O_{7-x}$ channel layer is carried out in a range of from 720° C. to 780° C., and under an oxygen pressure of 100 mTorr, and the step of forming the insulating layer is carried out in a range of from 650° C. to 750° C., and wherein said protective layer has a thickness of from 10 to 50 nm and said insulating layer has a thickness of from 100 to 500 nm.

9. The method as defined in claim 1, wherein during performing the step of forming the $SrTiO_3$ protective layer, the $YBa_2Cu_3O_{7-x}$ channel layer between the $SrTiO_3$ protective layer and the surface portion of the template layer is strained by a stress to be changed to a stress-changed layer.

10. The method as defined in claim 1, wherein during performing the step of forming the $YBa_2Cu_3O_{7-x}$ layer the $YBa_2Cu_3O_{7-x}$ layer is grown in such a manner that a-axis of the $YBa_2Cu_3O_{7-x}$ layer is perpendicular to the substrate by means of the template layer.

* * * * *